(12) United States Patent
Liu et al.

(10) Patent No.: US 10,764,526 B1
(45) Date of Patent: Sep. 1, 2020

(54) SPATIAL DERIVATIVE PIXEL ARRAY WITH ADAPTIVE QUANTIZATION

(71) Applicant: Facebook Technologies, LLC, Menlo Park, CA (US)

(72) Inventors: Xinqiao Liu, Medina, WA (US); Jakob Julian Engel, Seattle, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/177,971

(22) Filed: Nov. 1, 2018

Related U.S. Application Data

(60) Provisional application No. 62/580,377, filed on Nov. 1, 2017.

(51) Int. Cl.

| | |
|---|---|
| *H04N 5/378* | (2011.01) |
| *H04N 5/341* | (2011.01) |
| *H04N 5/347* | (2011.01) |
| *H04N 5/374* | (2011.01) |
| *H04N 5/3745* | (2011.01) |
| *H04N 5/369* | (2011.01) |
| *H01L 27/146* | (2006.01) |

(52) U.S. Cl.
CPC ............. *H04N 5/378* (2013.01); *H04N 5/341* (2013.01); *H04N 5/347* (2013.01); *H04N 5/379* (2018.08); *H04N 5/3742* (2013.01); *H04N 5/37457* (2013.01); *H01L 27/1464* (2013.01); *H01L 27/14641* (2013.01)

(58) Field of Classification Search
CPC ...... H04N 5/341; H04N 5/347; H04N 5/3742; H04N 5/37457; H04N 5/378; H04N 5/379

See application file for complete search history.

(56) References Cited

U.S. PATENT DOCUMENTS

| | | | |
|---|---|---|---|
| 9,819,885 B2 * | 11/2017 | Furukawa | H03M 1/56 |
| 2010/0013969 A1 * | 1/2010 | Ui | H04N 5/35545 348/294 |
| 2013/0229543 A1 * | 9/2013 | Hashimoto | H04N 5/35545 348/222.1 |
| 2019/0104263 A1 * | 4/2019 | Ochiai | H04N 5/341 |
| 2019/0104265 A1 * | 4/2019 | Totsuka | H04N 5/361 |

* cited by examiner

*Primary Examiner* — Daniel M Pasiewicz
(74) *Attorney, Agent, or Firm* — Kilpatrick Townsend & Stockton LLP

(57) ABSTRACT

A photo sensor includes a plurality of pixel blocks, each including one or more anchor pixels and one or more non-anchor pixels. The anchor pixels produce first sensor signals and the non-anchor pixels produce second sensor signals. An amplifier circuit amplifies the first and second sensor signals. A variable bit-depth analog to digital converter (ADC) circuit quantizes amplified versions of the first sensor signals into first digitized sensor signals with a first bit-depth. The ADC circuit also quantizes amplified versions of the second sensor signals into second digitized sensor signals with a second bit-depth that is lower than the first bit depth. The second bit-depth may be selected based on anchor pixel statistics derived from the one or more first digitized sensor signals.

28 Claims, 7 Drawing Sheets

US 10,764,526 B1

SPATIAL DERIVATIVE PIXEL ARRAY WITH ADAPTIVE QUANTIZATION

CROSS REFERENCE TO RELATED APPLICATION

This application claims the benefit of U.S. Provisional Application No. 62/580,377, filed Nov. 1, 2017, which is incorporated by reference.

BACKGROUND

Field of Technology

The present disclosure relates generally to optical sensors, and more particularly, to a sensor that uses output from designated anchor pixels to quantize the output from other, non-anchor pixels.

Discussion of the Related Art

Optical sensors are electronic detectors that convert light into an electronic signal. In photography, a shutter is a device that allows light to pass for a determined period of time, exposing the optical sensors to the light in order to capture an image of a scene. Rolling shutter is a method of image capture in which a still picture or each frame of a video is captured by scanning across the scene rapidly in a horizontal or vertical direction. That is, every pixel is not captured at the same time; pixels from different rows are captured at different times. Rolling shutter is mostly used in cell phone sensors. Machine vision, in contrast, uses global shutter where every pixel is captured at the same time.

Most optical sensors use backside illumination. A back-illuminated sensor is a type of digital optical sensor that uses a particular arrangement of imaging elements to increase the amount of light captured, improving low-light performance. A traditional front-illuminated digital camera is constructed similarly to the human eye, with a lens at the front and photodetectors at the back. This orientation of the sensor places the active matrix of the digital camera sensor, a matrix of individual picture elements, on its front surface and simplifies manufacturing. The matrix and its wiring, however, reflect some of the light, reducing the signal that is available to be captured. A back-illuminated sensor contains the same elements, but arranges the wiring behind the photocathode layer by flipping the silicon wafer during manufacturing and then thinning its reverse side so that light can hit the photocathode layer without passing through the wiring layer, thereby improving the chance of an input photon being captured.

However, there are problems associated with conventional back-illuminated sensors. Storage is exposed to light, which causes higher leakage. Also, the photodiode fill factor, or the ratio of light-sensitive area of a pixel to total pixel area, is low. A large fill factor is generally preferred because more of the pixel area is used for photocollection, which simultaneously improves signal-to-noise ratio (SNR) and dynamic range. The dynamic range of an image sensor measures how wide of a range of lighting the sensor can accurately capture. The wider the dynamic range of the image sensor, the more details can be shown under low light conditions and thus the more versatile the imaging system becomes. The SNR of an image sensor measures the ratio between the signal and its associated noise. An image sensor with low SNR will have a high amount of noise appearing in the captured image. An image sensor with high SNR may be used effectively in low light conditions.

Image sensors regularly include millions of pixels. In some environments, the amount of power and/or bandwidth for communicating data available to an image sensor can be limited. Consequently, an image sensor that with improved power and/or bandwidth efficient may be advantageous.

SUMMARY

Embodiments relate to an image sensor having pixels that are partitioned into multiple blocks. The pixels in each block are divided into anchor pixels and non-anchor pixels. Full quantization is performed on sensor signals from anchor pixels while quantization on non-anchor pixels is performed with a lower bit-depth. The quantization parameters used for the non-anchor pixels may be based on the quantized signals from the anchor pixels. For example, the quantization parameters may also be adjusted based on the minimum, means, maximum, and deviation of quantized signal values from the anchor pixels. Using these techniques, the bandwidth and/or power requirements of the image sensor may be reduced.

In one embodiment, a photo sensor includes a plurality of pixel blocks. Each pixel block includes one or more anchor pixels and one or more non-anchor pixels. The one or more anchor pixels produce one or more first sensor signals and the one or more non-anchor pixels produce one or more second sensor signals. The photo sensor also includes an amplifier circuit configured to amplify the one or more first sensor signals and the one or more second sensor signals. The photo sensor further includes a variable bit-depth analog to digital converter (ADC) circuit configured to quantize amplified versions of the one or more first sensor signals into one or more first digitized sensor signals with a first bit-depth. The ADC circuit is further configured to quantize amplified versions of the one or more second sensor signals into one or more second digitized sensor signals with a second bit-depth that is lower than the first bit depth. The second bit-depth may be selected based on anchor pixel statistics derived from the one or more first digitized sensor signals.

DETAILED DESCRIPTION

Figure 1:
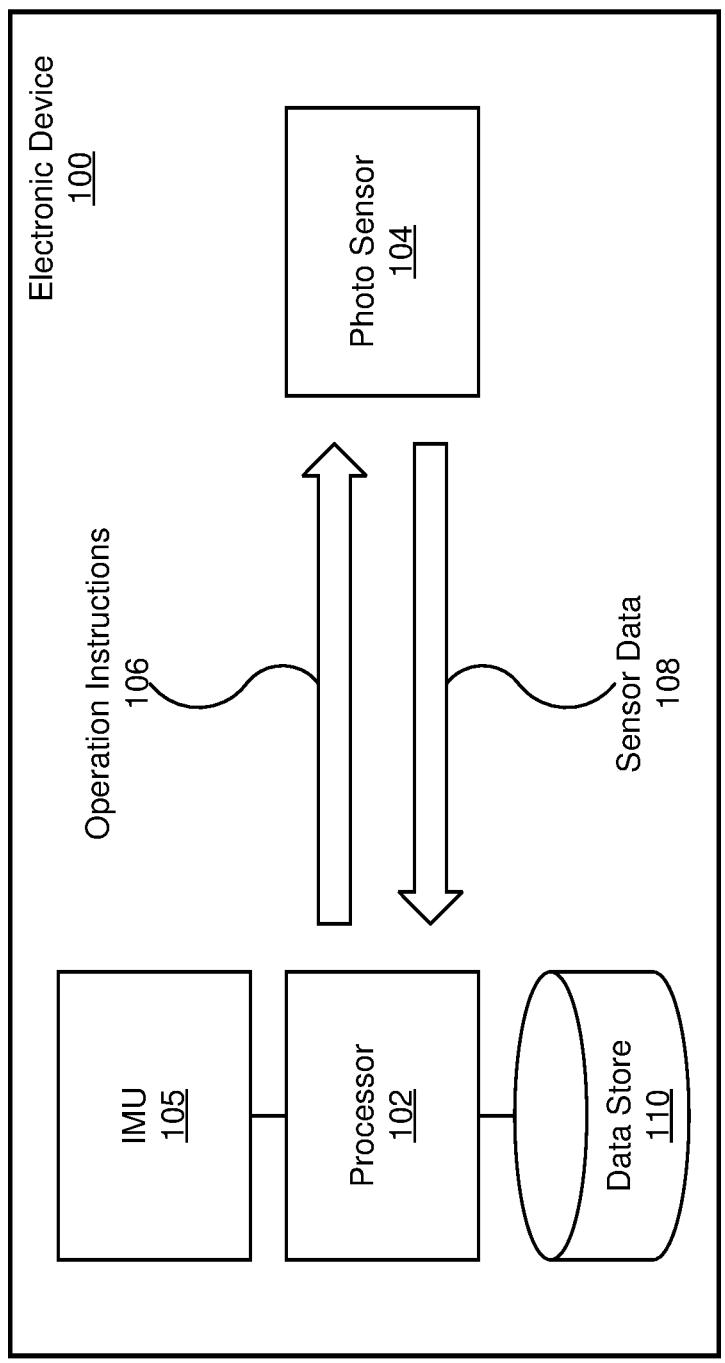
FIG. 1 is a block diagram illustrating an electronic device including a photo sensor, according to one embodiment.

Reference will now be made in detail to various embodiments, examples of which are illustrated in the accompanying drawings. Whenever possible, the same reference numbers will be used throughout the drawings to refer to the same or like parts. A letter after a reference numeral, such as "310A," indicates that the text refers specifically to the element having that particular reference numeral and letter. A reference numeral in the text without a following letter, such as "340," refers to any or all of the elements in the figures bearing that reference numeral (e.g. "340" in the text refers to reference numerals "340A," "340B," and/or "340C" in the figures).

Embodiments relate to a pixel array of a photo sensor that is divided into multiple blocks. Each block has anchor pixels which have their sensor signals quantized with a larger bit-depth and non-anchor pixels which have their sensor signals quantized with a smaller bit-depth. The sensor signals of the anchor pixels within each block may be processed to determine anchor pixel statistics (e.g., minimum value, mean value, and maximum value). The anchor pixel statistics may be used to modify amplification or quantization parameters of sensor signals from the non-anchor pixels in the same block. The modifiable quantization parameters include the bit-depth and the dynamic range of the quantization.

Example System Architecture

FIG. 1 illustrates one embodiment of an electronic device 100 that includes a photo sensor 104. In the embodiment shown, the electronic device 100 includes, among other components, a processor 102 and a photo sensor 104 that are commutatively coupled. The processor 102 may also be communicatively coupled to a data store 110 and/or an inertial measurement unit (IMU) 105. The electronic device 100 may include other components not illustrated in FIG. 1 such as memory and various other sensors.

The processor 102 is an electronic circuit that performs operations on a data source. The data source may include the photo sensor 104 that provides sensor data 108. The processor 102 generates operation instructions 106 that are sent to the photo sensor 104. The processing performed by the processor 102 may include an analog-digital conversion of the sensor data 108, which converts voltage analog signals or current analog signals into digital signals.

The photo sensor 104 is a circuit that measures light intensity and performs a photoconversion. Measuring light intensity may involve detecting light by a photodiode and the photoconversion may involve converting the light by the photodiode into a voltage or current signal.

The data store 110 is one or more computer readable media configured to store data generated by the photo sensor 104 and/or instructions that may be executed by the processor to cause the electronic device to perform the functions described herein. In one embodiment, the data store 110 is a non-transitory computer readable medium within the electronic device, such as a hard disk, solid-state memory, or the like. Although the data store 110 is shown as being coupled with the processor 102, in some embodiments, the photo sensor 104 may send data directly to the data store 110.

The IMU 105 measures forces exerted on the electronic device 100 to determine acceleration of the device. The IMU 105 may use a combination of accelerometers, gyroscopes, magnetometers, and the like to determine the forces experienced by the device 100. In one embodiment, the IMU 105 detects changes in yaw, pitch, and roll of the device 100, which can be used to estimate the motion of the device.

Figure 2:
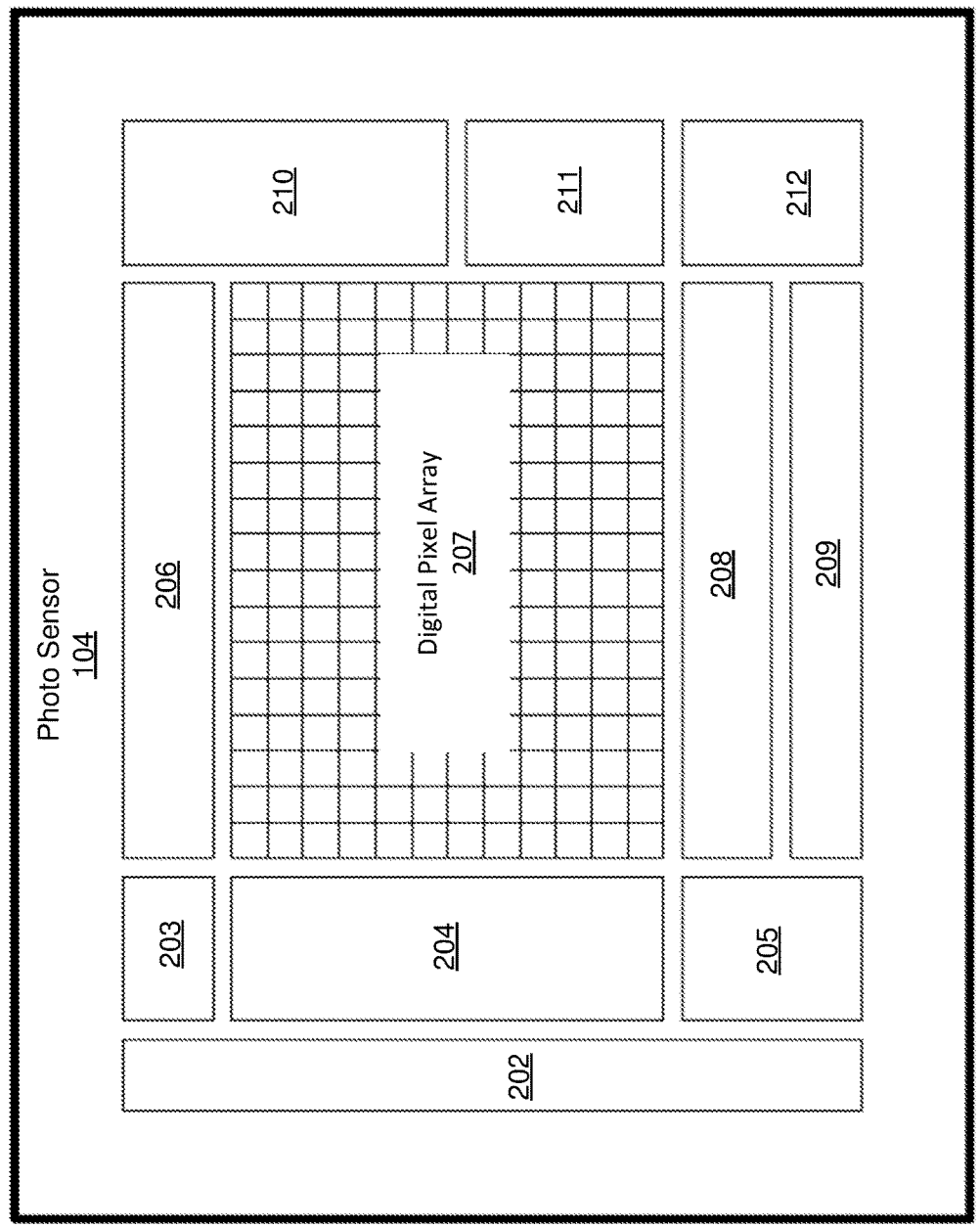
FIG. 2 is a view illustrating the architecture of the photo sensor shown in FIG. 1, according to one embodiment.

FIG. 2 is a schematic view illustrating the photo sensor 104, according to one embodiment. The photo sensor 104 includes, among other components, a digital block 202, a global counter 203, a row drivers and global signal drivers module 204, Mobile Industry Processor Interface (MIPI) 205, counter buffers 206, a digital pixel array 207, sense amplifiers 208, a line memory 209, a power conditioner 210, a ramp generation and buffers module 211, and a sense amplification control module 212.

The digital block 202 is a circuit that processes digital signals associated with the operation of the photo sensor 104. In one or more embodiments, at least part of the digital block 202 may be provided as part of the digital pixel array 207 instead of being a circuit separate from the digital pixel array 207.

The global counter 203 is a digital sequential logic circuit constructed of cascading flip-flops, and provides counter signals to various components of the photo sensor 104.

The row drivers and global signal drivers module 204 is a circuit that provides signals to rows of pixels via scan lines (not shown). The signal provided to each row of pixels indicates sensing of sensor signal and/or resetting operations at each row of pixels.

MIPI 205 is a serial interface for transmitting the sensor data 108 from the photo sensor 104 to the processor 102. An MIPI interface typically has a single clock lane and two data lanes (not shown) that carry serial data. These three lanes carry signals on pairs of wires where the signals are often differential.

The counter buffers 206 is a circuit that receives counter signals from the global counter 203, and sends signals to columns of pixels in the digital pixel array 207 to coordinate sensing and resetting operations.

The digital pixel array 207 includes a plurality of pixels. In one embodiment, the digital pixel array is arranged in two dimensions, addressable by row and column. Each pixel is configured to sense light and output a signal corresponding to the intensity of the input light. The pixels are divided into blocks (e.g., five pixels by five pixels), with some pixels designated as anchor pixels and others designated as non-anchor pixels. For example, the central pixel and each of the four corner pixels of a block might be designated as anchor pixels with remainder being non-anchor pixels.

The sense amplifiers 208 are elements in the read circuitry that are used to the read out of the digital signals from the digital pixel array 207. The sense amplifiers 208 sense low power sensor signals from a bitline that represents the intensity of light captured by the pixels in the digital pixel array 207. In one embodiment, a sense amplifier 208 includes switches for selecting a pixel for which the sensor signal is to be read, an analog amplifier for amplifying the sensor signal, and an analog-to-digital converter (ADC) to quantize the amplified sensor signals to generate a digital output representing the intensity of light captured by the selected pixel. The sensor signals of anchor pixels may be quantized with a high bit-depth (e.g., fully quantized) while the sensor signals from other pixels may be quantized relative to one (or more) of the anchor pixels at a lower bit depth. Some or all of the sense amplifiers 208 may be included in the digital pixel array 207. Additional details of an example embodiment of the sense amplifier 208 are provided below, with reference to FIGS. 3 and 5.

The line memory 209 temporarily stores the sensed digital values of the light intensity detected at the digital pixel array 207, as sensed by the sense amplifiers 208 and processed by digital block 202 (whether fully quantized or relative to one or more anchor pixels) before sending the digital values to the processor 102 via MIPI 205 as the sensor data 108.

The power conditioner 210 is a circuit that improves the quality of the power that is delivered to components of the photo sensor 104. The power conditioner 210 may maintain and deliver a constant voltage that allows the components of the photo sensor 104 to function properly. In one embodiment, the power conditioner 210 is a power line conditioner which takes in power and modifies the output voltages based on the requirements of the components connected to the power line conditioner. In other embodiments, other types of power conditioner may be used.

The ramp generator and buffers module 211 comprises a ramp generator and buffers. The ramp generator is a function generator that increases its voltage to a particular value. The ramp generator may be used to avoid jolts when changing a load. The buffers provide electrical impedance transformation from one circuit to another to prevent the ramp generator from being affected by the load.

The sense amplification control module 212 adjusts one or more operational parameters of the sense amplifiers 208 based on current operating conditions. The operational parameters may include the gain of the amplifier, the dynamic range of the ADC, the bit-depth of the ADC, etc. In one embodiment, the sense amplification control module 212 receives the quantized sensor signals for the anchor pixels in a block and calculates the anchor pixel statistics for that block from the quantized sensor signals. The sense amplification control module 212 adjusts operational parameters of the sense amplifier 208 for the block based on the anchor pixel statistics. The sense amplification control module 212 may also provide biasing voltage signal to the sense amplifiers 208. The biasing voltage signal is a predetermined voltage for the purpose of establishing proper operating conditions of the sense amplifiers 208 such as a steady DC voltage.

The embodiment of the photo sensor 104 of FIG. 2 is merely illustrative. The photo sensor 104 may include other components such as a signal processing module to enhance the raw sensor signal generated by the ADC. Alternatively, a serial interface other than MIPI interface be used to communicate with the processor 102. Further, one or more components illustrated in FIG. 2 may be omitted.

Example Photo Sensor Configuration

Figure 3:
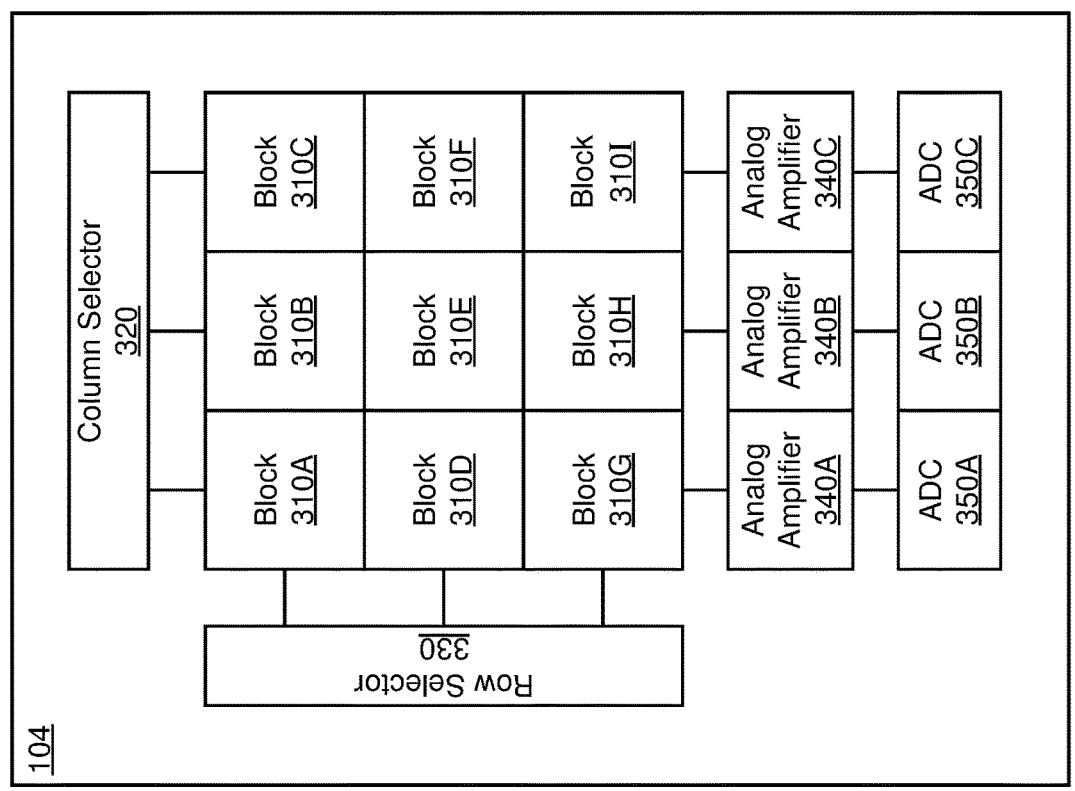
FIG. 3 is a block diagram illustrating the photo sensor shown in FIG. 1, according to one embodiment.

FIG. 3 illustrates one embodiment of a photosensor 104 suitable for use in the electronic device 100. In the embodiment shown in FIG. 3, the photosensor 104 includes a set of pixel blocks 310, a column selector 320, a row selector 330, a set of analog amplifiers 340, and a set of analog to digital convertors (ADCs) 350. Although only nine pixel blocks 310 are shown for illustrative purposes, in practice, the photo sensor 104 may contain any number of pixel blocks.

In other embodiments, the photosensor 104 may include different and/or additional components. For example, if the photosensor contains a separate amplifier 340 and ADC 350 for each pixel block 310, the column selector 320 and row selector 330 may be omitted.

Figure 4:
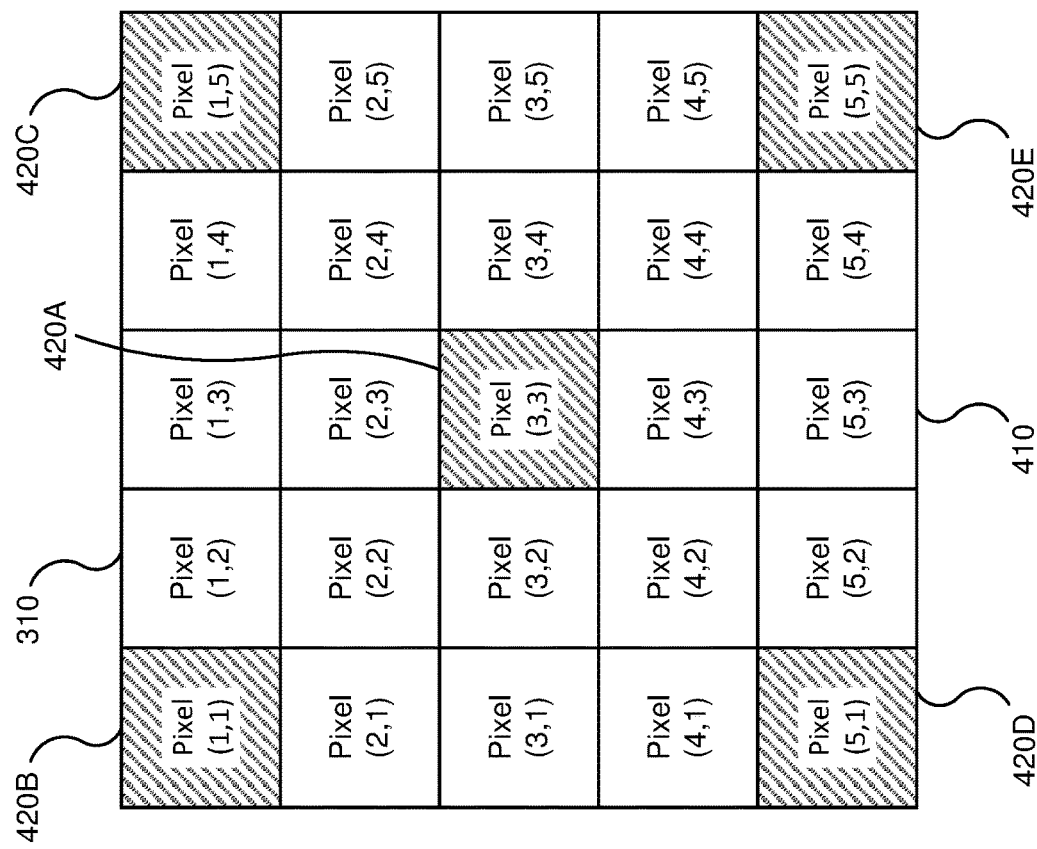
FIG. 4 illustrates a block of pixels in a photo sensor, according to one embodiment.

A pixel block 310 includes at least one anchor pixel and at least one non-anchor pixel. Sensor signals from anchor pixels may be fully quantized while sensor signals from non-anchor pixels may be compared to a sensor signal from an anchor pixel and then quantized with a lower bit-depth. FIG. 4 shows an example configuration for a pixel block 310 that includes twenty-five pixels in a five by five grid. In the configuration shown, the central pixel 420A in the block 310 along with the corner pixels 420B through 420E (hereinafter collectively referred to as "pixels 420") are anchor pixels. The remaining pixels in the block 310 are non-anchor pixels 410. Other configurations of pixel blocks 310 may include different number of pixels and/or different distributions of anchor pixels 420 and non-anchor pixels 410. For example, in another configuration, a predetermined number of anchor pixels 420 may be randomly distributed in the pixel block 310.

Referring back to FIG. 3, the column selector 320 and row selector 330 include control circuitry for selection of a particular block (or blocks) for current data collection. For example, selection of the first column by the column selector 320 and first row by the row selector 330 selects pixel block 310A. Pixel block 310A selectively provides pixel outputs (as described below with reference to FIG. 5) to analog amplifier 340A to amply the sensor signals from the pixels. The amplified sensor signals from analog amplifier 340A are provided to ADC 350A. In the embodiment shown in FIG. 3, pixel blocks 310A, 310D, and 310G share analog amplifier 340A and ADC 350A. Thus, the total number of analog amplifiers 340 and ADCs 350 included in the photo sensor 104 may be reduced, with the column selector 320 and row selector 330 activating each of blocks 310A, 310D, and 310G in turn according to a predetermined pattern or order. Similarly, blocks 310B, 310E, and 310H share analog amplifier 340B and ADC 350B, while blocks 310C, 310F, and 310I share analog amplifier 340C and ADC 350C. Sharing amplifiers 340 and ADCs 350 may enable smaller pixels. For example, the longest side of the pixels may be in the range from 0.8 to 2 micrometers, inclusive. In other examples, even smaller pixels may be used. In other embodiments, different combinations of blocks 310, amplifiers 340, and ADCs 350 may be used (including each block having its own amplifier and ADC).

The analog amplifiers 340 amplify the signals from pixels in a block 310 and the amplified signals are quantized by the ADCs 350. The analog amplifiers 340 may be differential amplifiers, log amplifiers, or a combination of both types. The combination of an analog amplifier 340 and an ADC 350 along with the circuitry for sequentially connecting the amplifier to non-anchor pixels 410 and anchor pixels 420 is an example of a sense amplifier 208. As used herein, sequentially means in a predetermined order, but need not proceed from a first pixel, to a second pixel, to a third pixel, etc.

Figure 5:
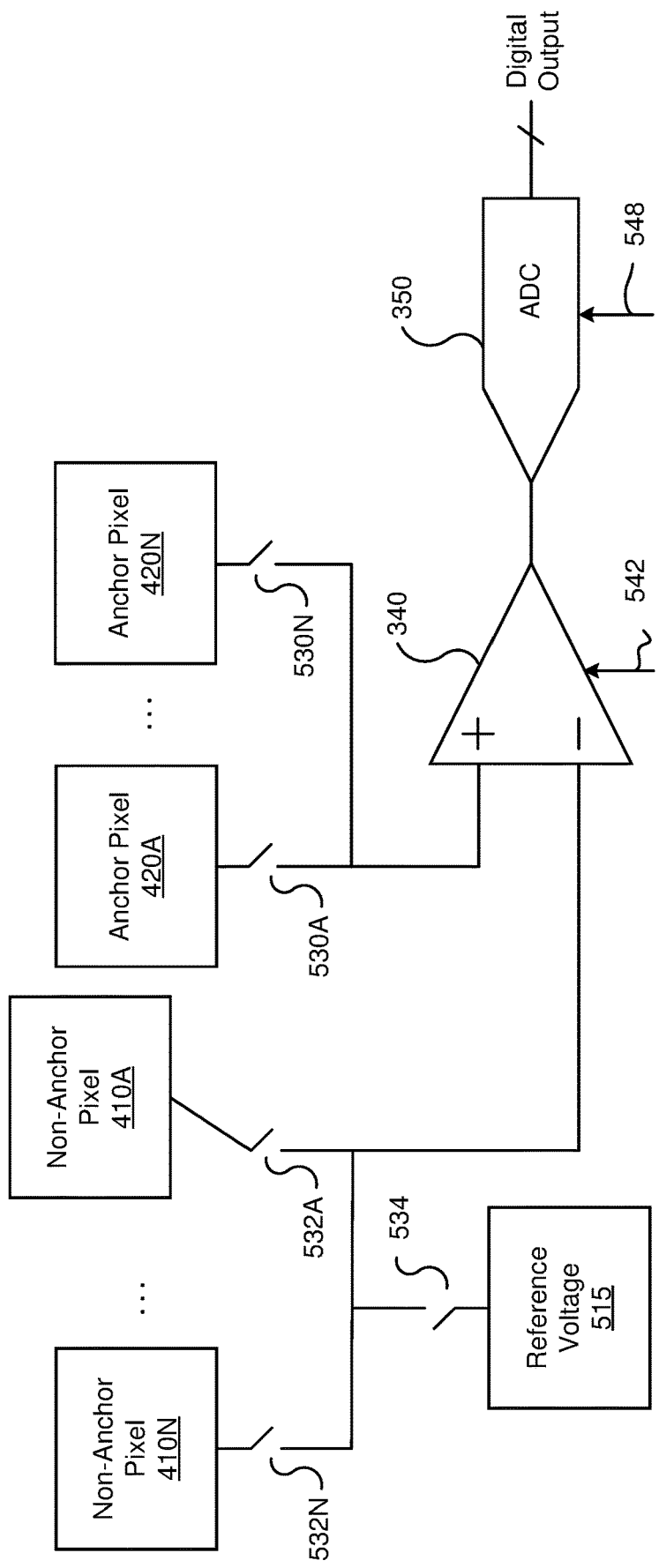
FIG. 5 is a simplified circuit diagram illustrating a configuration of a sense amplifier, according to one embodiment.

FIG. 5 is a simplified circuit diagram illustrating an embodiment of a sense amplifier 208. In the embodiment shown, a pixel block 310 includes a set of anchor pixels 420A through 420N and a set of non-anchor pixels 410A through 410N. A set of anchor pixel switches 530A through 530N are configured to selectively connect any of the anchor pixels 420 to one of the inputs of the amplifier 340 (in this case, the positive input). A set of non-anchor pixel switches 532A through 532N along with a reference voltage switch 534 are configured to selectively connect one of the non-anchor pixels 410 or the reference voltage 515 to the other input of the amplifier 340 (in this case, the negative input).

In one embodiment, the sense amplifier 208 may operate in a first mode or a second mode. In the first mode, one input of the analog amplifier 340 (in this case, the negative input) is coupled to the reference voltage 515 by closing switch 534. The non-anchor pixel switches 532 remain open in the first mode. The other input of the analog amplifier 340 (in this case, the positive input) is sequentially coupled to each anchor pixel 420 in the block by sequentially closing the corresponding anchor pixel switches 530 while the other anchor pixel switches are open. For example, anchor pixel 420A may be coupled to the analog amplifier 340 by closing anchor pixel switch 530A. Anchor pixel switch 530A is then opened and anchor pixel switch 530N closed to couple the amplifier 340 to anchor pixel 420N, etc. Thus, the sensor signal for each anchor pixel 420 may be determined relative the voltage level of the reference voltage 515. The sense amplification control module 212 may then determine the anchor pixel statistics from the sensor signals measured for the anchor pixels 420.

In the second mode, one input of the analog amplifier 340 (in this case, the positive input) is coupled to one of the anchor pixels 420 (e.g., the center pixel 420A) by closing the corresponding anchor pixel switch 530 while the other anchor pixel switches are open. The other input of the analog amplifier 340 (in this case, the negative input) is sequentially coupled to each non-anchor pixel 410 by sequentially closing the non-anchor pixel switches 532 while the other non-anchor pixel switches and the reference voltage switch 534 are open. Thus, the sensor signal for each non-anchor pixel 410 may be determined relative to the sensor signal for the coupled anchor pixel 420. The sense amplification control module 212 may set operational parameters (e.g., amplifier gain, ADC dynamic range, or ADC bit-depth) for the second mode based on the anchor pixel statistics, as described previously.

If the analog amplifier 340 is embodied as a differential amplifier, the amplifier output is proportional to the voltage difference between the positive and negative inputs. If the analog amplifier 340 is embodied as a log amplifier, the amplifier output is proportional to the ratio of the positive and negative voltage inputs. In either case, the analog output from the amplifier 340 is provided to an ADC 350 which quantizes the amplified sensor signal to convert it into a digital signal. The ADC 350 may have an adjustable bit-depth. The ratios between the positive and negative voltage inputs may have a smaller range than the differences between voltage inputs, which may enable a lower bit-depth to be used.

In one embodiment, when one input of the amplifier 340 is connected to an anchor pixel 420 (by closing the corresponding anchor pixel switch 530 while the other anchor pixel switches are open) and the other input is connected to the reference voltage 515 (by closing the reference voltage switch 534 while the non-anchor pixel switches 532 are open), the bit-depth of the ADC 350 is set to a high value (e.g., a maximum bit-depth of the ADC). Thus, the sensor signal from the anchor pixel 420 (relative to the reference voltage 515) can be determined with a high degree of granularity. This is referred to herein as full quantization. However, "full quantization" may refer to any quantization performed on an amplified version of the sensor signal by an ADC 350 with a greater bit-depth than quantization by the ADC on other amplified sensor signals that are digitized with a lower bit-depth. Such full quantization is not necessarily the maximum possible bit-depth of the ADC.

When one output from the amplifier 340 is connected to an anchor pixel 420 (by closing the corresponding anchor pixel switch 420 while the other anchor pixel switches are open) and the other input is connected to a non-anchor pixel 410 (by closing the corresponding non-anchor pixel switch 532 while the other non-anchor pixel switches and the reference voltage switch 524 are open), the bit-depth of the ADC 350 may be set to a low value (e.g., lower than the bit depth used for full quantization). Thus, the sensor signal from the non-anchor pixel 410 can be determined relative to the output of the currently connected anchor pixel at a lower bit depth than was used for the anchor pixel 420. For example, the central anchor pixel 420A may be connected to one input of the amplifier 340 by closing switch 530A and non-anchor pixel 410A may be connected to the other input of the amplifier by closing switch 532A (while all other switches are open).

The quantization of the sensor signals from non-anchor pixels 410 at a lower bit-depth may reduce the bandwidth and/or power used by the photo sensor 104. In other words, an absolute value is determined for the output from an anchor pixel 420 (relative to a reference voltage 515) with high granularity and the output from a non-anchor pixel 410 is determined relative to the output of the anchor pixel 420 at a lower granularity. The lower granularity may be used for non-anchor pixels 410 because, generally, the value of the corresponding sensor signals will be similar to the sensor signals from the anchor-pixels 420 in the block. Thus, the anchor pixel statistics derived from the fully quantized anchor pixel values provide a base line with the sensor signals for the non-anchor pixels 420 being interpreted relative to the baseline. Example methods for processing the outputs from a pixel block 310 are described in greater detail below, with reference to FIG. 6.

In one embodiment, the exposure time for each block 310 can be adjusted separately based on the local light intensity. This can improve the dynamic range of the photosensor 104 overall by enabling blocks 310 with lower local light intensities to use longer exposure times to generate meaningful data without causing blocks with higher local light intensities to become saturated. For example, the mean output from the anchor pixels 420 in the previous frame may be used to adjust the exposure time for a block 310 for the current frame. Alternatively, a pre-reading may be obtained for one or more pixels in the block 310 (e.g., the center pixel 420A, all of the anchor pixels 420, etc.) that is used to set the exposure time for the reading itself. In another embodiment, the output from the IMU 105 is used to determine which pixel block 310 was closest to the current position and orientation of a current pixel block when that pixel block's previous frame has generated. The readings from the previous frame of that pixel block 310 are then used to set the exposure time for the current pixel block. In other words, the exposure time for the current pixel block 310 is based on location rather than the previous frame of the same pixel block (unless the device 100 has not moved a significant amount since the previous frame). For example, the device 100 (or a computing device coupled with the device) may track the position of features from frame to frame. The IMU 105 may be used to estimate the change in position and orientation of the device 100 and thus predict the location of a tracked feature in the next image. An estimate of the light intensity for the track feature can be determined from the previous image or images. The estimated light intensity may be used to set the exposure time for one or more pixel blocks 310.

The operation of the analog amplifier 340 and the operation of the ADC 350 may be adjusted by control signals 542, 548 received from the sense amplification control module 212. As described above with reference to FIG. 2, the operational parameters for the analog amplifier 340 (e.g., the gain of the amplifier) and the operational parameters for the ADC 350 (e.g., the dynamic range of the ADC and the bit-depth of the ADC) are determined by the sense amplification control module 212. After the operational parameters are determined, the control signals 524, 548 are sent to the analog amplifier 542 and the ADC 350, respectively.

Example Method for Operating a Photo Sensor

Figure 6:
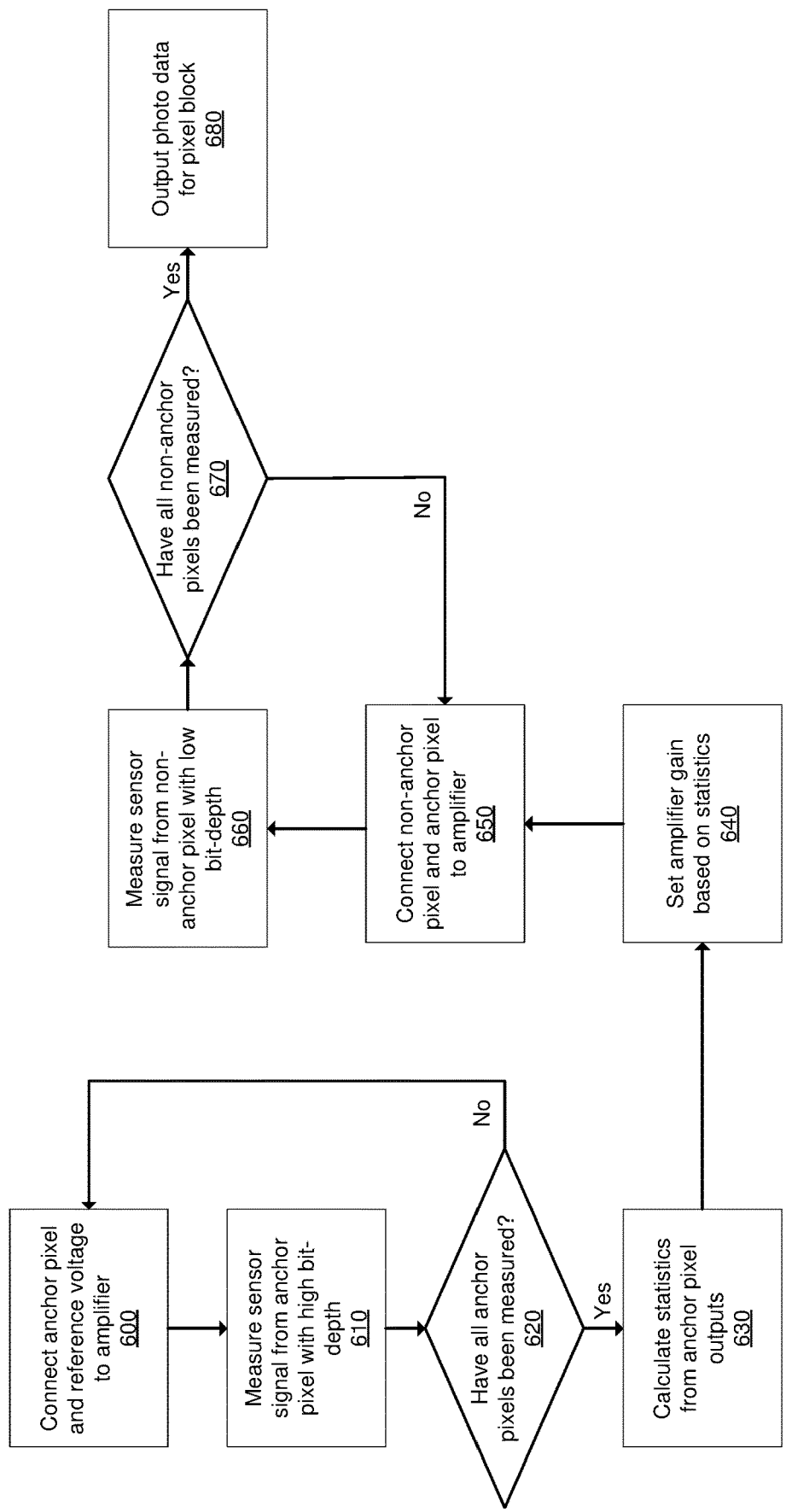
FIG. 6 is a flowchart illustrating a method for operating a pixel block of a photo sensor, according to one embodiment.

FIG. 6 illustrates an example method for operating a pixel block 310 of a photo sensor 104, according to one embodiment. The steps of FIG. 6 are shown from the perspective of an electronic device 100 with a photo sensor 104 performing the method. However, some or all of the steps may be performed by other entities. In addition, some embodiments may perform steps in parallel, perform the steps in different orders, or perform different steps.

In the embodiment shown in FIG. 6, the method begins by connecting 600 an anchor pixel 420 and the reference voltage 515 to the amplifier 340. For example, switches 530A and 524 can be closed to connect anchor pixel 420A and the reference voltage 515, respectively, to the amplifier 340. The combination of the amplifier 340 and the ADC 350 measures 610 the sensor signal from the anchor pixel 420A. The amplifier 340 determines the difference between or ratio of the sensor signal from the anchor pixel 420A and the reference voltage level of the reference voltage 515 (depending on whether a differential or logarithmic amplifier is being used). The ADC 350 digitizes the output from the amplifier 240 with a high bit-depth (e.g., the maximum bit depth achievable using the ADC 350 or a preselected bit-depth to use for anchor pixels). Thus, the digitized output from the ADC 350 provides a measure of the sensor signal from the anchor pixel 420A.

It is determined 620 whether there are additional anchor pixels 420 in the pixel block 310 for which the output has not been measured 610. If there is, one of the unmeasured anchor pixels 420 is connected 600 to the amplifier 340 and the reference voltage 515 remains connected or is reconnected to the amplifier 340. The sensor signal of the anchor pixel 420 is then measured 610 with the high-bit depth. This process may continue until the sensor signals of all of the anchor pixels 420 have been measured 610.

If the sensor signals for all of the anchor pixels 420 have been measured 610, the sense amplification control module 212 calculates 630 anchor pixel statistics from the digitized sensor signals of the anchor pixels 420. In one embodiment, the anchor pixel statistics include one or more of the minimum, mean, maximum, and deviance values of the digitized sensor signals of the anchor pixels 420 in the pixel block 310. The amplifier gain may be set 640 based on the anchor pixel statistics to adjust the amplitude gain for sensor signals from non-anchor pixels. For example, the gain may be set 640 to the highest value that would not cause the maximum digitized sensor signal value to clip. The gain may be set to allow for a predetermined amount of headroom to account for non-anchor pixels 410 that may have been subject to a higher illumination level than any of the anchor pixels 420. Alternatively, the gain may be set such that the mean anchor pixel sensor signal multiplied by the gain is a predetermined constant. In other embodiments, other methods may be used to set 640 the gain.

A non-anchor pixel 410 and an anchor pixel 420 are connected 650 to the amplifier 340. In some embodiments, the anchor pixel 410 connected 650 to the amplifier 340 is in the center of the pixel block 310 (e.g., center pixel 420A). The amplifier 340 outputs the difference between or ratio of the sensor signals of the non-anchor pixel 410 and the anchor pixel 420 (depending on whether a differential or logarithmic amplifier is being used). The ADC 350 digitizes the output from the non-anchor pixel 410 at a low bit-depth (relative to the bit-depth used for the anchor pixels 420). Thus, the digitized output from the ADC 350 provides a measure of the sensor signal of the non-anchor pixel 410 (because the output from the anchor pixel 420 has already been measured 620). In one embodiment, the specific bit-depth used is selected based on the anchor pixel statistics. For example, if there is a large difference between the minimum and maximum outputs from anchor pixels 420, a higher bit-depth might be selected. In contrast, if there is little variation in the outputs from anchor pixels 420, a relatively low bit-depth might be used. As another example, the anchor pixel statistics may include the mean and standard deviation of the anchor pixel outputs. If the ratio between the standard deviation and mean is large, a higher bit-depth may be used. Conversely, if that ratio is low, a lower bit-depth may be sufficient.

The electronic device 100 determines 670 whether there are additional non-anchor pixels 410 in the pixel block 310 for which the output has not been measured 660. If there is, one of the unmeasured non-anchor pixels 410 is connected 650 to the amplifier 340. The anchor pixel 420 remains connected or is reconnected to the amplifier 340. The output of the non-anchor pixel 410 is then measured 610 with the low-bit depth. This process may continue until all of the non-anchor pixels 410 have been measured 660.

If all of the non-anchor pixels 410 have been measured, the processing for the pixel block 310 ends (for the current frame). Outputting 680 the results may include storing the results in the data store, transmitting them to another device (e.g., via a network), displaying the results on a screen, or any other suitable output for the results. The device 100 may then repeat the same or a similar method for the next pixel block 310. Alternatively, if all (or some) of the pixel blocks 310 are operated simultaneously, the device 100 may proceed by repeating the same or a similar method to generate the next frame from the pixel block 310.

Example Stacked Photo Sensor Assembly

In some embodiments, the photo sensor 104 is in a stacked configuration that includes two vertically stacked substrates. The two substrates are connected via interconnects at a pixel level to provide a signal from a photodiode at a first substrate to circuitry on a second substrate. The circuitry on the second substrate performs operations that would otherwise be performed on the first substrate. More specifically, charge storage of the first substrate may be replaced with capacitors on the second substrate. A voltage signal corresponding to the amount of charge in the first substrate is generated and processed in the second substrate. By stacking the first and second substrates, the photo sensor assembly can be made more compact while increasing or at least retaining the photodiode fill factor of the photo sensor assembly.

Figure 7:
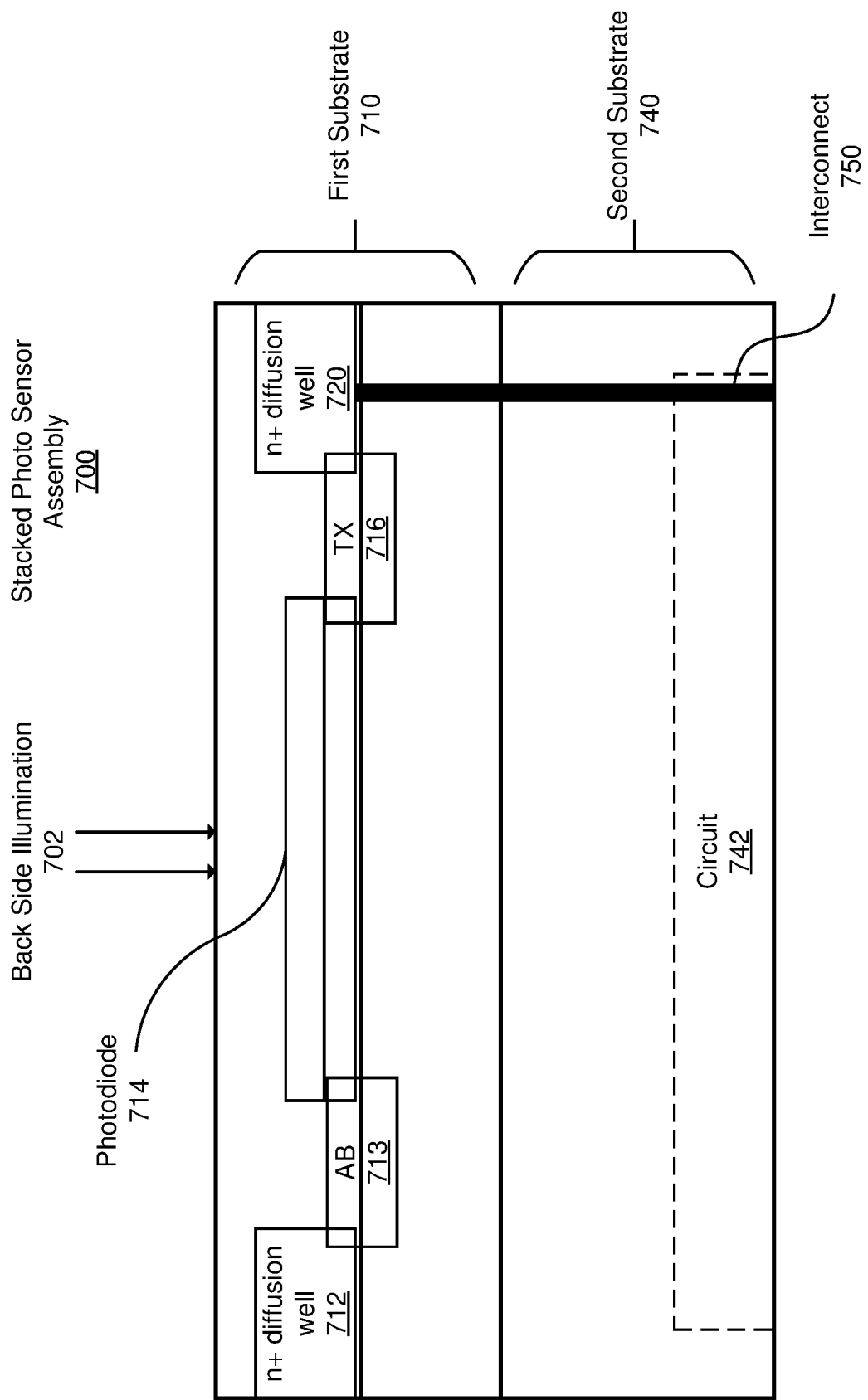
FIG. 7 is a cross-sectional view illustrating a stacked photo assembly for a photo sensor, according to one embodiment.

FIG. 7 illustrates one embodiment of a stacked photo sensor assembly 700. In the embodiment shown, the stacked photo assembly 700 includes a first substrate 710 coupled to a second substrate 740. The first substrate 710 may be a back-side illumination 702 sensor that is flipped over and includes, among other components, a first n+ diffusion well 712, a photodiode 714, a transistor AB 713, a transistor TX 716, and a second n+ diffusion well 720.

Each of transistor AB 711 and transistor TX 716 includes an active layer and a drain electrode coupled to the active layer. A photodiode 714 serves as a source for both transistor AB and transistor TX. The stacked photo sensor assembly 700 may also include an insulation layer over the active layer and a gate electrode (not shown). By controlling a voltage level at the gates of the transistors AB 711 and the transistor TX 716, the transistors AB 711 and the transistor TX 716 can be turned on or off. The gates of these transistors receive signals from circuits external to the digital pixel array 207.

In one embodiment, the first n+ diffusion well 712 is an N doped implant region formed in the first substrate 710. The first n+ diffusion well 712 receives photoelectrons that are transferred from the photodiode 714 when transistor AB 713 is turned on during non-exposure times. This is equivalent to a closed shutter mode in a traditional film camera. The transfer of photoelectrons from the photodiode 714 to the n+ diffusion well 712 may help ensure that no photoelectrons are accumulated on the photodiode 714 during the non-exposure times, which are periods when no signal is generated. The n+ diffusion well 712 is typically connected to a positive voltage source, for example VDD, so the photoelectrons are drained away. During an exposure time, which is equivalent to the shutter open mode in a film camera, transistor AB 713 and transistor TX 716 are turned off and the photoelectrons are initially stored inside the photodiode 714. At the end of the exposure period, transistor TX 6716 is turned on. As a result, the charge stored in the photodiode 714 is transferred to the second n+ diffusion well 720.

The photodiode 714 is a semiconductor device that converts light into an electric current. Current is generated when photons are absorbed in the photodiode 714. The photodiode 714 may be a p-n junction or PIN structure. When the intensity of light through back-side illumination 702 is higher, the amount of charge accumulated on the photodiode 714 is high. Similarly, when the intensity of light through back-side illumination 702 is lower, the amount of charge accumulated on the photodiode 714 is low.

The interconnect 750 may be a pixel level direct interconnect from n+ diffusion well 720 to a circuit 742 in the second substrate 740. In one embodiment, the interconnect 750 transmits a voltage signal that reflects the amount of charge transferred from the photodiode 714 to the n+ diffusion well 720. In alternative embodiments, the interconnect 750 transmits a current signal that reflects the amount of charge transferred from the photodiode 714 to the n+ diffusion well 720. The interconnect 750 carries the voltage signal to the circuit 742 for further processing such as sampling and analog-to-digital conversion. In still other embodiments, the stacked photo sensor assembly 700 may include additional interconnects that also transmit signals from the circuit 742 of the second substrate 740 to the first substrate 710. For example, signals for controlling transistor AB 713 and transistor TX 716 may be transmitted from the circuit 742 via these additional interconnects.

Embodiments move various circuit components provided on the first substrate 710 in conventional photo sensors to the second substrate 740, and connect the circuits of the second substrate 740 to the components in the first substrate 710 via the pixel level interconnect 750. The various circuit components moved to the second substrate 740 may include, among others, switches 532A through 532N, switches 530A through 530N, amplifiers 340, ADCs 350, and a reference voltage source 515. In this way, the area occupied by components in the first substrate 710 can be beneficially reduced and the fill factor can be increased.

Example Circuitry of a Pixel of the Photo Sensor

Figure 8:
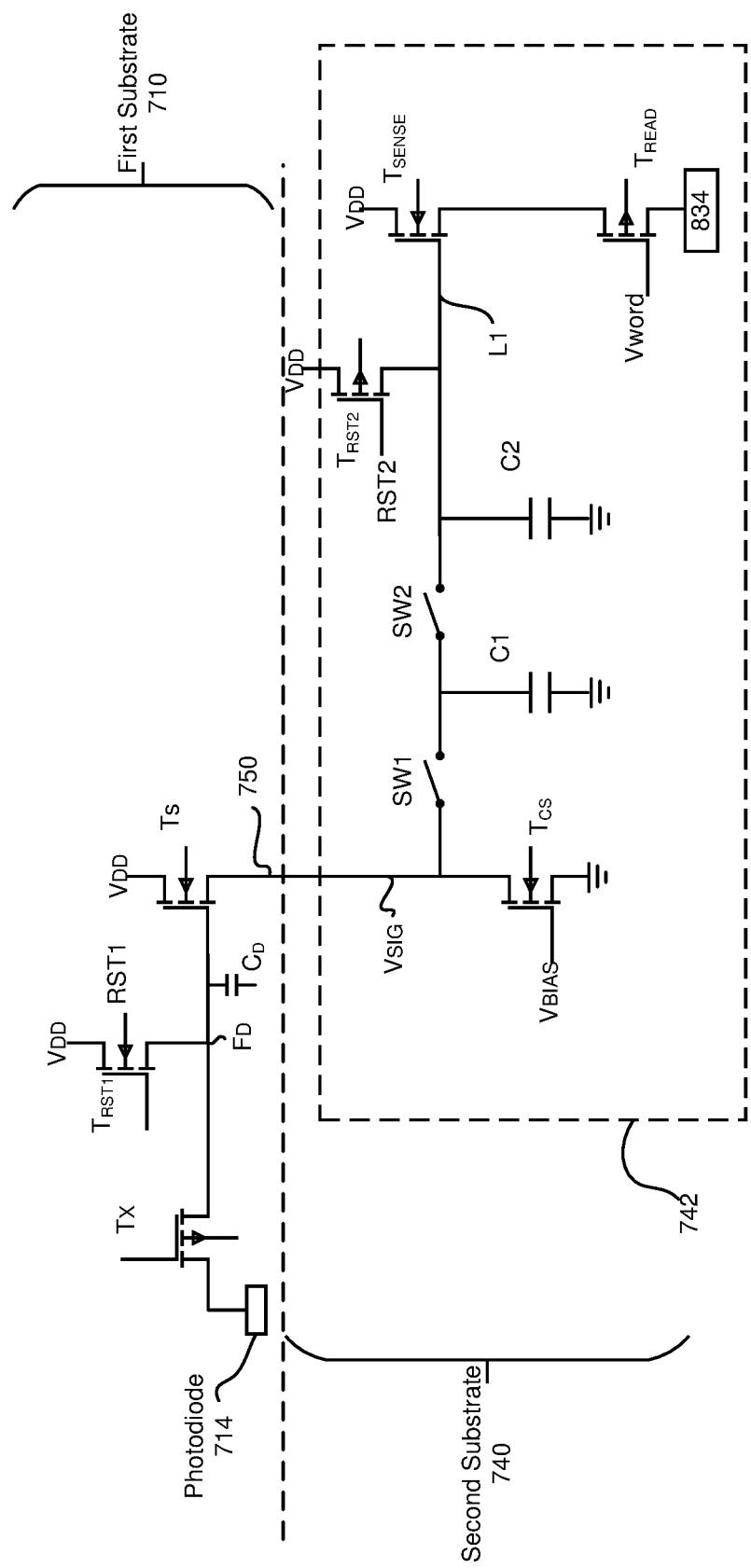
FIG. 8 is a circuit diagram illustrating the circuitry of a pixel of a photo sensor, according to one embodiment.

FIG. 8 is a circuit diagram illustrating the circuitry of a pixel of a stacked photo sensor 700, according to one embodiment. In the embodiment of FIG. 8, the first substrate 710 includes the photodiode 714, transistor TX, transistor $T_{RST1}$ and transistor $T_S$. Parasitic capacitance $C_D$ is also present in the first substrate 710 between the transistor $T_{RST1}$ and the transistor $T_S$. The operation of photodiode 714 and transistor TX is described above with reference to FIG. 7.

Transistor $T_{RST1}$ functions to reset the voltage at floating diffusion point $F_D$ when transistor $T_{RST1}$ is turned on. A drain terminal of the transistor $T_{RST1}$ is connected to a voltage source VDD and a source terminal of the transistor $T_{RST1}$ is connected to the floating diffusion point $F_D$. The floating diffusion point $F_D$ is reset after each cycle of exposure and sensing. The floating diffusion point $F_D$ is connected to the second n+ diffusion well 720.

Transistor $T_S$ is a source follower amplifier having its gate connected to the floating diffusion point $F_D$. A drain terminal of the transistor $T_S$ is connected to a voltage source VDD and a source terminal of the transistor $T_S$ is connected to the interconnect 750. The voltage signal $V_{SIG}$ corresponds to a voltage level at the source terminal of the transistor $T_S$ as defined by the voltage level at the floating diffusion point $F_D$.

The second substrate 740 may include transistor $T_{CS}$, switch SW1, switch SW2, transistor $T_{RST2}$, transistor $T_{SENSE}$, and TREAD. Transistor $T_{CS}$ operates as a current source. In one embodiment, the gate of transistor $T_{CS}$ is applied with a pulse of bias voltage $V_{BIAS}$ at the start of the readout phase to turn off the transistor $T_{CS}$. The drain of the transistor $T_{CS}$ is connected to the interconnect 350 and the source of the transistor $T_{CS}$ is grounded.

Transistor $T_{RST2}$ is used for resetting the voltage at a terminal of capacitor C2. While switch SW2 is turned off, reset signal RST2 is provided to transistor $T_{RST2}$ to reset and store the reset voltage $V_{RST2}$ at the terminal of capacitor C2.

Transistor $T_{SENSE}$ is a source follower amplifier having its gate terminal connected to conductive line L1. The source of the transistor $T_{SENSE}$ is connected to a readout transistor TREAD. The readout transistor TREAD is turned on when a word line signal $V_{WORD}$ turns active, enabling the amplified version of the voltage at conductive line L1 to be sent to a pixel value readout circuit 834 (e.g., located outside the pixel).

One advantage of the configuration shown in FIG. 8 is that the first substrate does not include a storage capacitor for storing the charge transferred from the photodiode when the transistor TX is turned on. Because the storage capacitor is not required in the first substrate, the fill factor of the photo sensor can be increased. In other configurations, the first substrate may include a storage capacitor.

As used herein, any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments. This is done merely for convenience and to give a general sense of the disclosure. This description should be read to include one or at least one and the singular also includes the plural unless it is obvious that it is meant otherwise.

While particular embodiments and applications have been illustrated and described, it is to be understood that the described subject matter is not limited to the precise construction and components disclosed herein and that various modifications, changes and variations which will be apparent to those skilled in the art may be made in the arrangement, operation and details of the method and apparatus disclosed. The scope of protection should be limited only by any claims that issue.

What is claimed is:

1. A photo sensor comprising:
    a plurality of pixel blocks, each pixel block including:
        one or more anchor pixels configured to produce one or more first sensor signals; and
        one or more non-anchor pixels configured to produce one or more second sensor signals;
    an amplifier circuit configured to:
        generate one or more first output signals based on amplifying the one or more first sensor signal; and
        generate one or more second output signals based on one or more comparisons between the one or more second sensor signals and one of the one or more first sensor signals; and
    an analog to digital converter (ADC) circuit configured to:
        quantize the one or more first output signals into one or more first digitized sensor signals; and
        quantize the one or more second output signals into one or more second digitized sensor signals.

2. The photo sensor of claim 1, further comprising a plurality of switches configured to:
    in a first mode, couple a first input of the amplifier circuit to a reference voltage and couple a second input of the amplifier circuit sequentially to the one or more anchor pixels to generate the one or more first output signals, and
    in a second mode, sequentially couple the first input of the amplifier circuit to the one or more non-anchor pixels and couple the second input of the amplifier circuit to one of the anchor pixels to generate the one or more second output signals.

3. The photo sensor of claim 2, wherein the plurality of switches comprises:
    a first switch configured to selectively couple the reference voltage to the first input;
    a second switch configured to selectively couple one of the one or more anchor pixels to the second input; and
    a third switch configured to selectively couple one of the one or more non-anchor pixels to the first input.

4. The photo sensor of claim 1, wherein the one or more first output signals are quantized with a first bit-depth; and
    wherein the one or more second output signals are quantized with a second bit-depth.

5. The photo sensor of claim 4, wherein the first bit-depth is a maximum bit-depth of the ADC; and
    wherein the second bit-depth or a dynamic range of the ADC is selected based on anchor pixel statistics derived from the one or more first digitized sensor signals.

6. The photo sensor of claim 5, wherein the anchor pixel statistics include a mean of the one or more first digitized sensor signals.

7. The photo sensor of claim 5, wherein a gain of the amplifier circuit is set based on the anchor pixel statistics.

8. The photo sensor of claim 1, wherein an exposure time of pixels in a pixel block of the plurality of pixel blocks is set based on previous measurements of the one or more anchor pixels in the pixel block.

9. The photo sensor of claim 1, wherein the one or more anchor pixels in a pixel block of the plurality of pixel blocks includes a center pixel and a corner pixel of the pixel block.

10. The photo sensor of claim 1, wherein at least a subset of the plurality of pixel blocks shares the amplifier circuit and the ADC.

11. The photo sensor of claim 1, wherein an output of the amplifier circuit is proportional to a ratio of a first input of the amplifier circuit and a second input of the amplifier circuit.

12. The photo sensor of claim 1, wherein a longest side of pixels in a pixel block of the plurality of pixel blocks is less than two micrometers.

13. A method for operating a pixel block of a photo sensor, the method comprising:
    producing one or more first sensor signals by one or more anchor pixels of the pixel block;
    producing one or more second sensor signals by one or more non-anchor pixels of the pixel block;
    generating one or more first output signals based on amplifying the one or more first sensor signals;
    generating one or more second output signals based on one or more comparisons between the one or more second sensor signals and one of the one or more first sensor signals;
    quantizing the one or more first output signals into one or more first digitalized sensor signals; and
    quantizing the one or more second output signals into one or more second digitized sensor signals.

14. The method of claim 13, wherein quantizing the one or more first output signals comprises:
    sequentially coupling each of the one or more anchor pixels to a first input of an amplifier;
    coupling a reference voltage to a second input of the amplifier; and
    providing an output from the amplifier to an analog to digital converter (ADC) for quantizing.

15. The method of claim 14, further comprising setting a gain of the amplifier based on anchor pixel statistics derived from the one or more first sensor signals.

16. The method of claim 13, wherein quantizing output of the one or more second output signals comprises:
    coupling one of the one or more anchor pixels to a first input of an amplifier;
    sequentially coupling each of the one or more non-anchor pixels to a second input of the amplifier; and
    providing an output from the amplifier to an analog to digital converter (ADC) for quantizing.

17. A non-transitory computer-readable medium storing instructions for operating a pixel block of a photo sensor, the instructions, when executed by a processor, causing the photo sensor to perform operations including:
    producing one or more first sensor signals by one or more anchor pixels of the pixel block;
    producing one or more second sensor signals by one or more non-anchor pixels of the pixel block;
    generating one or more first output signals based on amplifying the one or more first sensor signals;

generate one or more second output signals based on one or more comparisons between the one or more second sensor signals and one of the one or more first sensor signals;

quantizing the one or more first output signals into one or more first digitalized sensor signals; and quantizing the one or more second output signals into one or more second digitized sensor signals.

18. The non-transitory computer-readable medium of claim 17, wherein quantizing the one or more first output signals comprises:

sequentially coupling each of the one or more anchor pixels to a first input of an amplifier;

coupling a reference voltage to a second input of the amplifier; and providing an output from the amplifier to an analog to digital converter (ADC) for quantizing.

19. The non-transitory computer-readable medium of claim 18, wherein the operations further comprise setting a gain of the amplifier based on anchor pixel statistics derived from the one or more first sensor signals.

20. The non-transitory computer-readable medium of claim 17, wherein quantizing output of the one or more second output signals comprises:

coupling one of the one or more anchor pixels to a first input of an amplifier;

sequentially coupling each of the one or more non-anchor pixels to a second input of the amplifier; and providing an output from the amplifier to an analog to digital converter (ADC) for quantizing.

21. The photo sensor of claim 1, wherein the one or more comparisons are generated based on amplifying one or more differences between the one or more second sensor signals and the one of the one or more first sensor signals.

22. The photo sensor of claim 1, wherein the one or more comparisons are generated based on amplifying one or more ratios between the one or more second sensor signals and the one of the one or more first sensor signals.

23. The photo sensor of claim 4, wherein the second bit-depth is reduced with respect to the first bit-depth based on a difference between a maximum output and a minimum output from the one or more anchor pixels being below a threshold; and wherein the second bit-depth is increased with respect to the first bit-depth based on the difference being above the threshold.

24. The photo sensor of claim 4, wherein the second bit-depth is adjusted based on a ratio between a standard deviation and a mean of outputs from the one or more anchor pixels.

25. The method of claim 13, wherein the one or more comparisons are generated based on amplifying one or more differences between the one or more second sensor signals and the one of the one or more first sensor signals.

26. The method of claim 13, wherein the one or more comparisons are generated based on amplifying one or more ratios between the one or more second sensor signals and the one of the one or more first sensor signals.

27. The non-transitory computer-readable medium of claim 17, wherein the one or more comparisons are generated based on amplifying one or more differences between the one or more second sensor signals and the one of the one or more first sensor signals.

28. The non-transitory computer-readable medium of claim 17, wherein the one or more comparisons are generated based on amplifying one or more ratios between the one or more second sensor signals and the one of the one or more first sensor signals.

* * * * *